(12) United States Patent
Wu (10) Patent No.: US 11,901,405 B2
(45) Date of Patent: Feb. 13, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Shuangshuang Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 346 days.

(21) Appl. No.: 17/487,697

(22) Filed: Sep. 28, 2021

(65) Prior Publication Data
US 2022/0085152 A1    Mar. 17, 2022

Related U.S. Application Data

(63) Continuation of application No. PCT/CN2021/101286, filed on Jun. 21, 2021.

(30) Foreign Application Priority Data

Sep. 11, 2020 (CN) .......................... 202010956310.6

(51) Int. Cl.
*H10B 12/00* (2023.01)
*H01L 49/02* (2006.01)

(52) U.S. Cl.
CPC .............. *H01L 28/91* (2013.01); *H01L 28/92* (2013.01); *H10B 12/033* (2023.02); *H10B 12/09* (2023.02)

(58) Field of Classification Search
CPC . H01L 28/90–92; H10B 12/03; H10B 12/033; H10B 12/30; H10B 12/09
See application file for complete search history.

(56) References Cited

U.S. PATENT DOCUMENTS

| 7,125,781 B2 | 10/2006 | Manning |
| 7,202,127 B2 | 4/2007 | Busch |
| 7,271,051 B2 | 9/2007 | Manning |

(Continued)

FOREIGN PATENT DOCUMENTS

| CN | 1890778 A | 1/2007 |
| CN | 207781561 U | 8/2018 |

(Continued)

OTHER PUBLICATIONS

Supplementary European Search Report in the European application No 21865655.1, dated Dec. 18, 2023. 7 pages.

*Primary Examiner* — Jose R Diaz
(74) *Attorney, Agent, or Firm* — Cooper Legal Group, LLC (57) ABSTRACT

A method for manufacturing a semiconductor structure includes: a substrate is provided, in which the substrate includes an array region and a peripheral region adjacent to each other, and the array region includes a buffer region connected with the peripheral region; a first dielectric layer, a first supporting layer, a second dielectric layer, a second supporting layer and a third dielectric layer, which are successively stacked onto one another, are formed on the substrate; a groove-type lower electrode, which at least penetrates through the third dielectric layer and the second supporting layer, is formed in the buffer region; the third dielectric layer is removed through a wet etching process; and the second supporting layer in the peripheral region is etched after the third dielectric layer is removed.

15 Claims, 11 Drawing Sheets

(56) References Cited

U.S. PATENT DOCUMENTS

| | | |
|---|---|---|
| 7,413,952 B2 | 8/2008 | Busch |
| 7,420,238 B2 | 9/2008 | Manning |
| 7,449,391 B2 | 11/2008 | Manning |
| 9,496,266 B2 | 11/2016 | Kim et al. |
| 10,607,855 B2 | 3/2020 | Yoon et al. |
| 2001/0044181 A1 | 11/2001 | Nakamura |
| 2003/0178684 A1 | 9/2003 | Nakamura |
| 2005/0054159 A1 | 3/2005 | Manning |
| 2005/0287780 A1 | 12/2005 | Manning |
| 2006/0014344 A1* | 1/2006 | Manning .............. H10B 12/033 438/243 |
| 2006/0051918 A1 | 3/2006 | Busch |
| 2006/0063344 A1 | 3/2006 | Manning |
| 2006/0063345 A1 | 3/2006 | Manning |
| 2007/0105303 A1 | 5/2007 | Busch |
| 2009/0275185 A1* | 11/2009 | Shea ...................... H10B 12/09 216/6 |
| 2013/0168812 A1 | 7/2013 | Lee |
| 2013/0286715 A1 | 10/2013 | Ikeda |
| 2016/0020212 A1 | 1/2016 | Kim et al. |
| 2018/0158827 A1 | 6/2018 | You |
| 2019/0027376 A1 | 1/2019 | Yoon et al. |
| 2022/0085151 A1* | 3/2022 | Wu ....................... H10B 12/00 |

FOREIGN PATENT DOCUMENTS

| | | |
|---|---|---|
| CN | 108717936 A | 10/2018 |
| CN | 208521929 U | 2/2019 |
| TW | I383472 B | 1/2013 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2021/101286, filed on Jun. 21, 2021, which claims priority to Chinese Patent Application No. 202010956310.6, filed on Sep. 11, 2020, entitled "SEMICONDUCTOR STRUCTURE AND METHOD FOR MANUFACTURING SEMICONDUCTOR STRUCTURE". The contents of International Patent Application No. PCT/CN2021/101286 and Chinese Patent Application No. 202010956310.6 are hereby incorporated by reference in their entireties.

TECHNICAL FIELD

The embodiments of this application relate to the field of semiconductor, and particularly relates to a semiconductor structure and a method for manufacturing the semiconductor structure.

BACKGROUND

As the size of the semiconductor structure is miniaturized, it becomes more and more difficult to increase or maintain the capacitance value of a single capacitor structure. When the same capacitor dielectric layer material is used, the increase of capacitance value can only be realized by increasing the surface area of an electrode plate or by reducing the thickness of the capacitor dielectric layer.

At present, a capacitor structure usually adopts a double-sided capacitor structure with a supporting layer. During the formation of the double-sided capacitor structure, etching defects often occur due to an edge size effect of a capacitor array and an etching load effect.

SUMMARY

According to some embodiments, a first aspect of this application provides a method for manufacturing a semiconductor structure. The method includes the following operations. A substrate is provided, in which the substrate includes an array region and a peripheral region adjacent, and the array region includes a buffer region connected with the peripheral region. A first dielectric layer, a first supporting layer, a second dielectric layer, a second supporting layer and a third dielectric layer, which are successively stacked onto one another, are formed on the substrate, in which the first supporting layer is arranged at least in the peripheral region and covers a top surface and a side wall of the first dielectric layer, the second dielectric layer covers the first supporting layer and the substrate, and each of the second supporting layer and the third dielectric layer is arranged in the array region and the peripheral region. A groove-type lower electrode, which at least penetrates through the third dielectric layer and the second supporting layer, is formed in the buffer region, in which a bottom surface of the groove-type lower electrode is located in the first dielectric layer or located in the second dielectric layer. The third dielectric layer is removed through a wet etching process. The second supporting layer in the peripheral region is etched after the third dielectric layer is removed.

According to the embodiments, a second aspect of this application provides a semiconductor structure. The semiconductor structure includes: a substrate, in which the substrate includes an array region and a peripheral region adjacent to each other, and the array region includes a buffer region connected with the peripheral region; a first dielectric layer, a first supporting layer and a second supporting layer, in which the first supporting layer is arranged in the peripheral region, the first supporting layer covers a top surface and a side wall of the first dielectric layer, the second supporting layer is arranged in the array region, and the second supporting layer is higher than the first supporting layer; and a groove-type lower electrode, in which the groove-type lower electrode is arranged in the buffer region and penetrates through the second supporting layer, and a bottom surface of the groove-type lower electrode is located in the first dielectric layer, or a bottom surface of the groove-type lower electrode is located on a side of the first supporting layer away from the first dielectric layer and is lower than the second supporting layer.

r

BRIEF DESCRIPTION OF THE DRAWINGS

One or more embodiments are exemplarily described by pictures in the corresponding drawings. These exemplary descriptions do not constitute a limitation on the embodiments. Unless otherwise stated, the figures in the drawings do not constitute a scale limitation.

DETAILED DESCRIPTION

FIG. 1 to FIG. 4 are schematic cross-sectional views of a semiconductor structure corresponding to the operations in a method for manufacturing the semiconductor structure.

Figure 1:
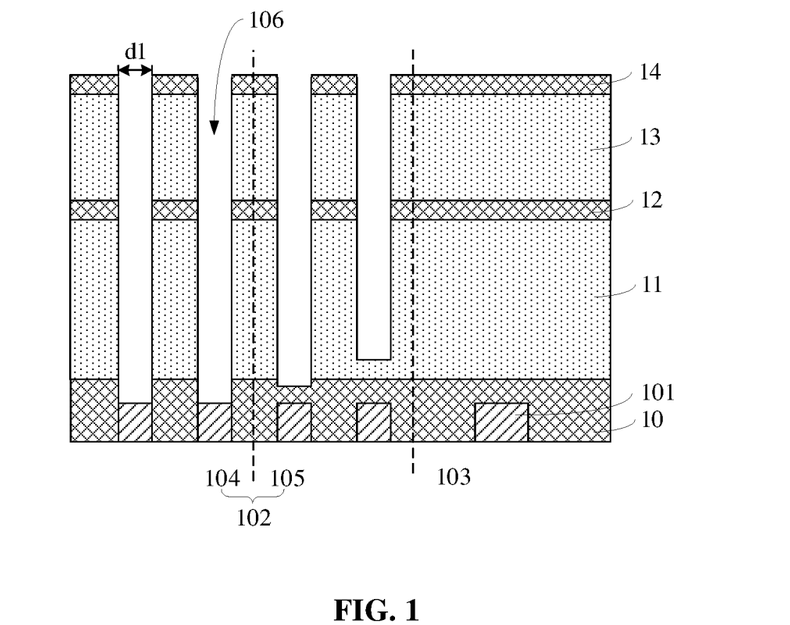
FIG. 1 to FIG. 4 are schematic cross-sectional views of a semiconductor structure corresponding to the operations in a method for manufacturing the semiconductor structure in an embodiment of this application.
Figure 2:
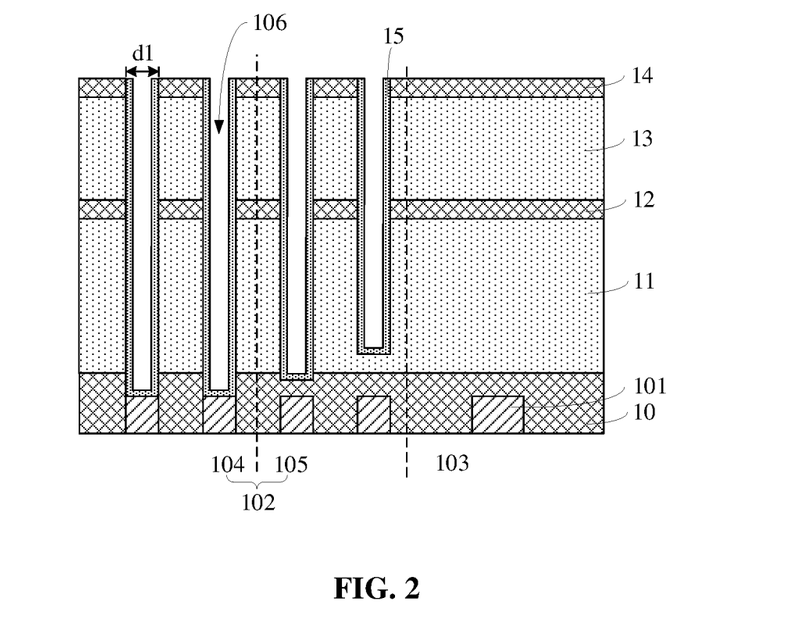

Referring to FIG. 1 and FIG. 2, capacitor grooves 106 exposing conductive structures 101 are formed in an array region 102, and the capacitor grooves 106 are configured to form groove-type lower electrodes 15.

A substrate 10 may be divided into an array region 102 and a peripheral region 103. The array region 102 includes a functional region 104 in a center of the array region 102 and a buffer region 105 at an edge of the array region 102. The conductive structures 101 are arranged in the substrate 10.

During the formation of the capacitor groove 106, due to the edge size effect, the width d1 of a top opening of the capacitor groove 106 gradually decreases in a direction from the array region 102 to the peripheral region 103. Furthermore, due to the etching load effect, the etching depth of the capacitor groove 106 arranged in the buffer region 105 is relatively shallow, that is, the bottom surface of the capacitor groove 106 may be located in the substrate 10 without exposing the conductive structure 101, or may be located in a first dielectric layer 11.

In addition, during the formation of the groove-type lower electrode 15 through a deposition process, since the width d1 of the top opening of the capacitor groove 106 in the buffer region 105 is relatively small and the ratio of the depth to the width is relatively large, it is difficult for an electrode material to evenly cover any surface of the capacitor groove 106. Therefore, the groove-type lower electrode 15 in the buffer region 105 may have an abnormal deposition thickness. Specifically, holes are formed at the bottom of the groove-type lower electrode 15 due to uneven deposition thickness, and the etching solution inside the groove-type lower electrode 15 can flow to the outer side of the groove-type lower electrode 15 through the holes.

Figure 3:
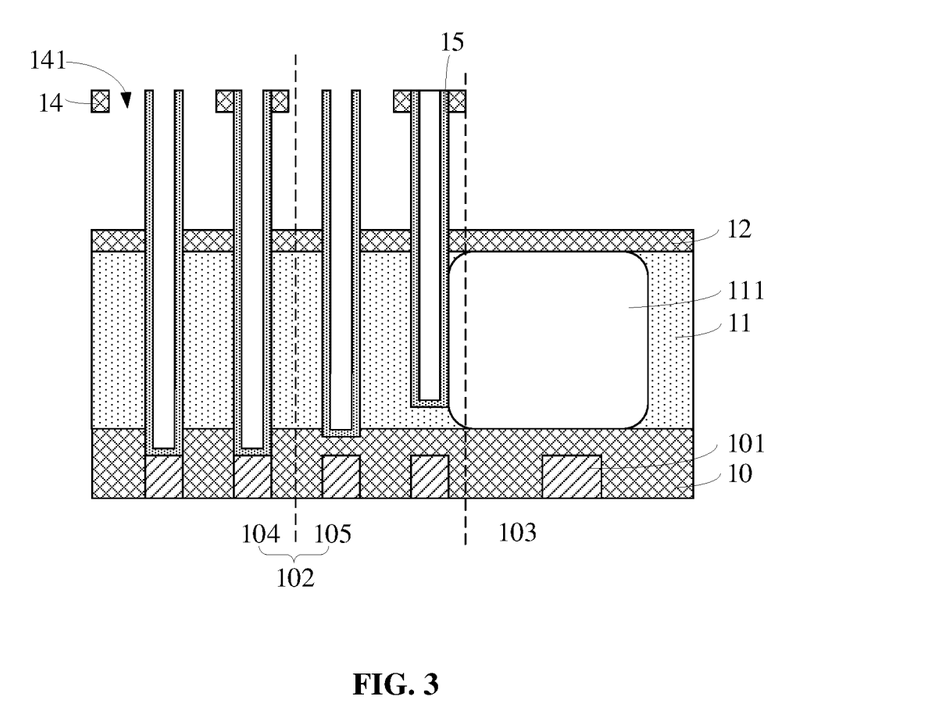

Referring to FIG. 3, a second supporting layer 14 is etched to form first openings 141, and a second dielectric layer 13 (referring to FIG. 2) is removed through the first openings 141.

In the process of etching the second dielectric layer 13, the groove-type lower electrode 15 with the exposed top is located in the buffer region 105, and a bottom surface of a part of the groove-type lower electrodes 15 is located in the first dielectric layer 11. Therefore, the etching solution for etching the second dielectric layer 13 will be in contact with the first dielectric layer 11 through the holes at the bottom of the groove-type lower electrode 15 and performs etching, so as to form a leakage hole 111 in the first dielectric layer 11. The leakage hole 111 may penetrate through the first dielectric layer 11.

Figure 4:
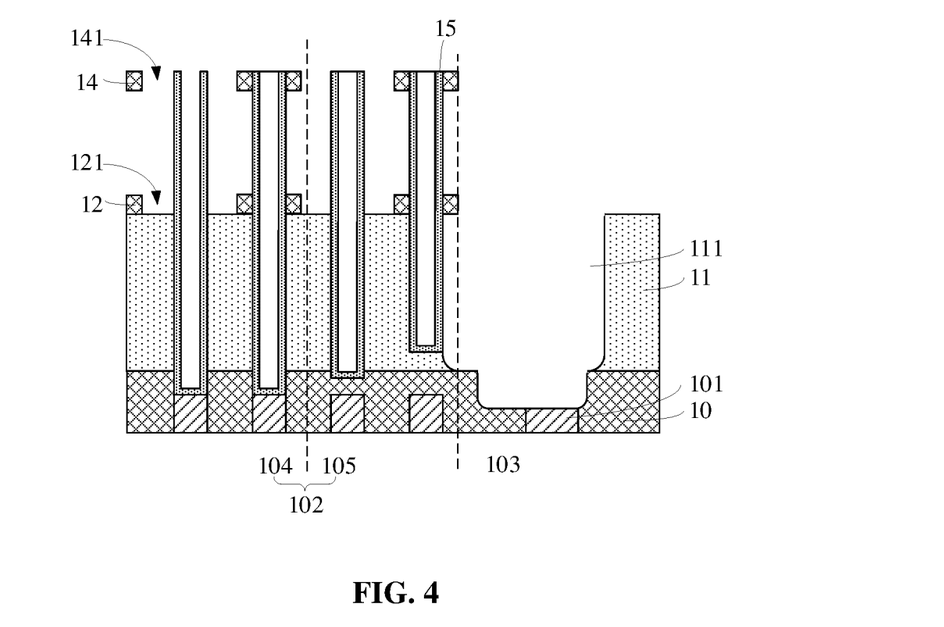

Referring to FIG. 4, a first supporting layer 12 is etched to form second openings 121.

During the formation of the second openings 121, the second supporting layer 12 located in the array region 102 and the peripheral region 103 needs to be etched. Since the leakage hole 111 penetrates through the first dielectric layer 11 to expose the substrate 10, after etching through the second supporting layer 12 in the peripheral region 103, the etching solution will flow to the surface of the substrate 10 through the leakage hole 111 to continuously etch the substrate 10, which causes over-etching a part of the substrate 10 and even causes peeling of a metal layer of the conductive structure 101.

In order to solve the above problems, the embodiments of this application provide a semiconductor structure and a method for manufacturing the semiconductor structure. The dielectric layer between the second supporting layer and the substrate is divided into two layers by arranging the first supporting layer. Further, the etching solution flowing out of the holes at the bottom of the groove-type lower electrode will only be in contact with one of the dielectric layers by adjusting the position relationship between the first supporting layer and the bottom surface of the groove-type lower electrode, so that the leakage hole will only exist in one dielectric layer. In this way, in the process of etching the second supporting layer, even if the second supporting layer is etched through, the etching solution will not be in direct contact with the substrate, but will be isolated from the substrate by the first dielectric layer or the second dielectric layer with an intact structure, thereby ensuring the structural integrity and functional integrity of the substrate in the peripheral region and the conductive structure.

In order to make the objectives, technical solutions and advantages of the embodiments of this application clearer, the embodiments of this application will be described in detail below with reference to the accompanying drawings. However, a person of ordinary skill in the art can understand that in the embodiments of this application, many technical details are proposed for readers to better understand this application. However, even without these technical details and various changes and modifications based on the following embodiments, the technical solutions claimed in this application can also be realized.

FIG. 5 to FIG. 21 are schematic views of a semiconductor structure corresponding to the operations in a method for manufacturing the semiconductor structure provided by an embodiment of this application.

Figure 5:
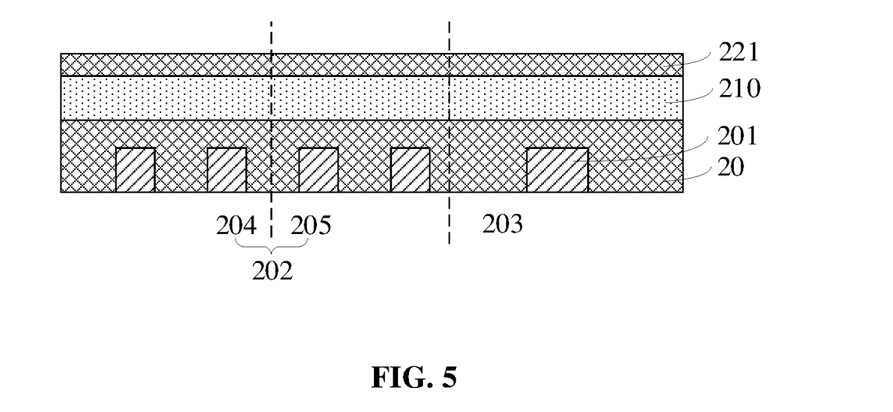
FIG. 5 to FIG. 21 are schematic views of a semiconductor structure corresponding to the operations in a method for manufacturing the semiconductor structure provided by an embodiment of this application.

Referring to FIG. 5, a substrate 20 is provided, and a first dielectric film 210 and a first supporting film 221, which are arranged on the substrate 20, are provided.

The substrate 20 includes an array region 202 and a peripheral region 203 adjacent to each other. The array region 202 includes a functional region 204 in a center of the array region 202 and a buffer region 205 at an edge of the array region 202. Conductive structures 201 are arranged in the substrate 20. The conductive structures 201 are arranged in the functional region 204, the buffer region 205 and the peripheral region 203.

In this embodiment, the material of the substrate 20 and the first supporting film 221 includes silicon nitride, and the silicon nitride in the substrate 20 can be used as an isolation structure for electrical isolation. The material of the first dielectric film 210 includes silicon dioxide. The conductive structure 201 may be a conductive contact region located in the substrate 20, such as an active region, or may be an independent conductive plug made of a metal material, such as a tungsten block.

Figure 6:
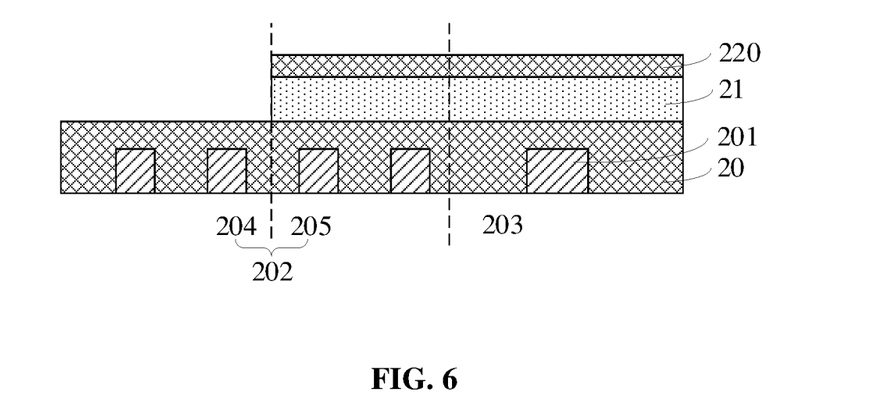
Figure 7:
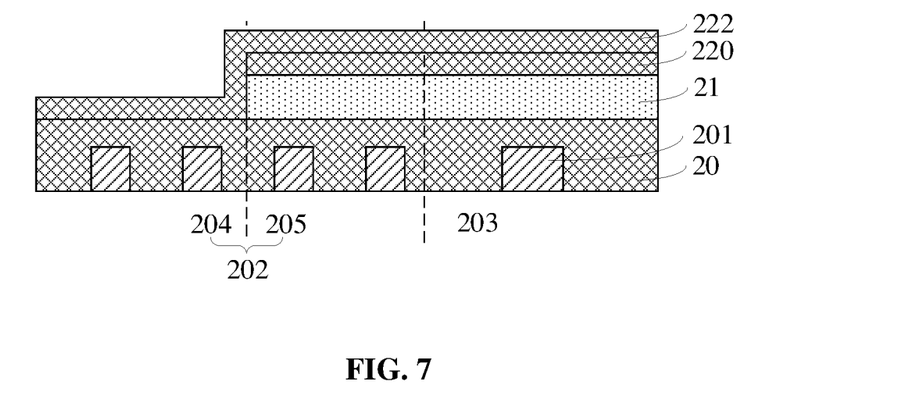
Figure 8:
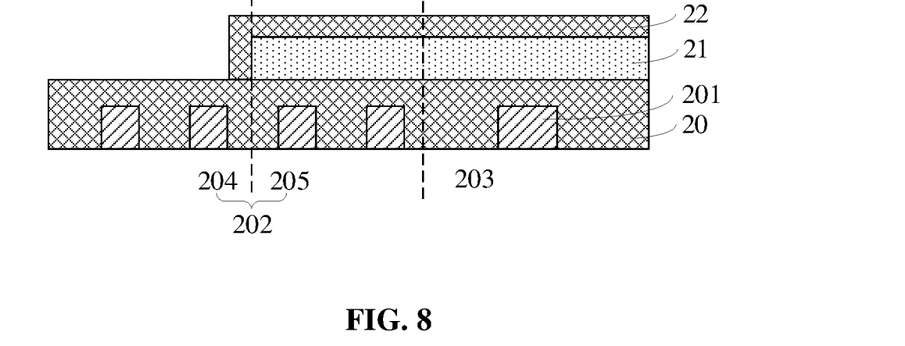

Referring to FIG. 6 to FIG. 8, a first dielectric layer 21 and a first supporting layer 22 are formed.

Specifically, referring to FIG. 6, the first dielectric film 210 and the first supporting film 221 in the functional region 204 are removed. The remaining portion of the first dielectric film 210 forms the first dielectric layer 21, and the remaining portion of the first supporting film 221 forms a first top supporting layer 220.

In this embodiment, the first top supporting layer 220 is located not only in the peripheral region 203, but also in the buffer region 205. The first top supporting layer 220 can provide a support for the groove-type lower electrode subsequently formed in the buffer region 205, thereby avoiding the groove-type lower electrode from breaking and forming defects due to lack of support.

Referring to FIG. 7, a second supporting film 222 covering the surface of the substrate 20, the side wall of the first dielectric layer 21 and the top surface of the first top supporting layer 220 is formed by a deposition process.

Referring to FIG. 8, the second supporting film 222 covering the surface of the substrate 20 and covering the top surface of the first top supporting layer 220 (referring to FIG. 7) is removed by a maskless dry etching process. The remaining portion of the second supporting film 222 forms a first side wall supporting layer (not marked), and the first top supporting layer 220 (referring to FIG. 7) and the first side wall supporting layer form the first supporting layer 22.

Since the first supporting layer 22 covers the top surface and the side wall of the first dielectric layer 21, the first supporting layer 22 can effectively isolate the first dielectric layer 21 from the subsequently formed second dielectric layer, so as to avoid the leaked etching solution from etching the first dielectric layer 21 and the second dielectric layer synchronously to ensure that one of the dielectric layers can play a role of isolating the etching solution from the other one of the dielectric layers. Furthermore, this avoids over-etching of the first dielectric layer 21 in the process of removing the second dielectric layer to ensure the structural integrity of the first dielectric layer 21.

The first dielectric layer 21 with an intact structure can be used as an additional supporting structure for the semiconductor structure to play a role of supporting the groove-type lower electrode and the conductive plug. The groove-type lower electrode is located in the buffer region 205, and the conductive plug is located in the peripheral region 203. In addition, the first dielectric layer 21 has an intact structure, which is favorable for preventing an upper electrode material from depositing between the first supporting layer 22 and the substrate 20. There is no need to provide an additional cleaning operation of the upper electrode material, and there is no need to reform the dielectric layer for electrically isolating the upper electrode from the conductive plug, to reduce the process operations and shorten the process cycle.

Figure 9:
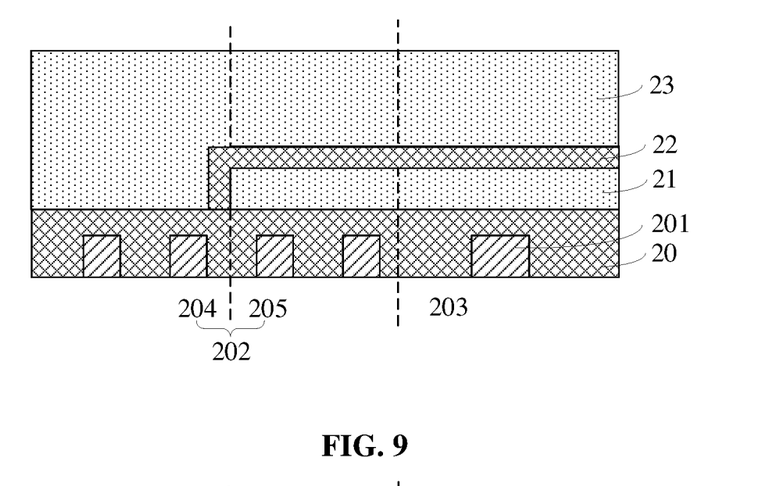
Figure 10:
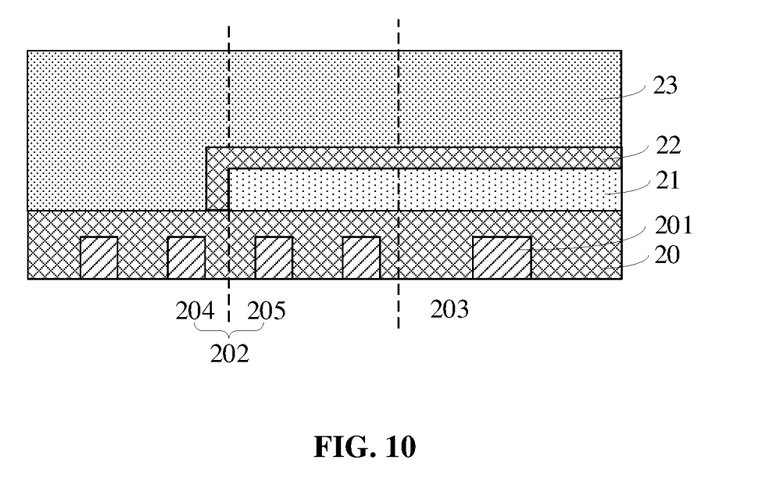

Referring to FIG. 9 and FIG. 10, a second dielectric layer 23 is formed, and ion doping is performed on the second dielectric layer 23.

In this embodiment, the etching rate of the second dielectric layer 23 after doping under a wet etching process is higher than the etching rate of the second dielectric layer 23 before doping, which is favorable for shortening the etching time of the second dielectric layer 23 and improving the manufacturing efficiency of the semiconductor structure.

Figure 11:
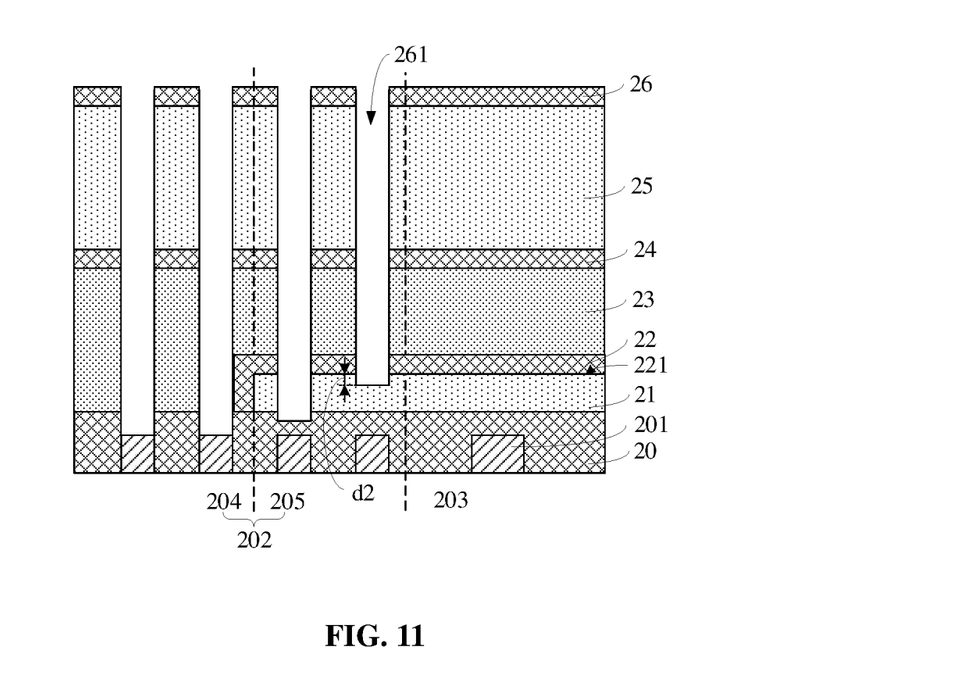

Referring to FIG. 11, a second supporting layer 24, a third dielectric layer 25 and a third supporting layer 26 are successively formed, and capacitor grooves 261 located in the functional region 204 and in the buffer region 205 are formed.

The material of the second supporting layer 24 and the third supporting layer 26 includes silicon nitride, and the material of the third dielectric layer 25 includes silicon dioxide.

Due to the edge size effect and the etching load effect, the capacitor groove 261 in the functional region 204 can expose the conductive structure 201 in the substrate 20, and there is a distance between the bottom surface of the capacitor groove 261 in the buffer region 205 and the conductive structure 201. Specifically, the bottom surface of the capacitor groove 261 in the buffer region 205 is located in the substrate 20, the first dielectric layer 21 or the second dielectric layer 23.

In this embodiment, the bottom surface of the capacitor groove 261 in the buffer region 205 is located in the substrate 20 or the first dielectric layer 21. In this way, when the etching solution leaks, a leakage hole is only formed in the first dielectric layer 21, the second dielectric layer 23 can be kept intact, and the second dielectric layer 23 can block the etching solution for etching the second supporting layer 24 to prevent the etching solution from etching the first supporting layer 22, thereby ensuring that the first supporting layer 22 can play a role of supporting the groove-type lower electrode in the buffer region 205.

In other embodiments, the bottom surface of the capacitor groove in the buffer region is located in the substrate or the second dielectric layer. It should be noted that this embodiment is based on the fact that the groove-type lower electrode with a bottom surface located in the substrate does not leak. When the groove-type lower electrode with a bottom surface located in the substrate also leaks, the bottom surface of the groove-type lower electrode in the buffer region is limited in the substrate or the first dielectric layer, which is favorable for avoiding the formation of leakage holes in both the first dielectric layer and the second dielectric layer, thereby preventing the etching solution from etching through the first supporting layer and then being in contact with the substrate, so as to ensure that the substrate and the conductive structure have preset performance.

In this embodiment, in a direction perpendicular to the surface of the substrate 20, the thickness d2 of a portion of the capacitor groove 261 in the first dielectric layer 21 ranges from 90 nm to 110 nm, such as 95 nm, 100 nm or 105 nm. Since hole defects are usually located in bottom corner regions of the groove-type lower electrode, it is necessary to control the holes in the side walls of the groove-type lower electrode to also be located in the first dielectric layer 21. That is, the thickness of the distribution region of the holes is less than or equal to the thickness d2 to ensure that the leaked etching solution only etches the first dielectric layer 21, thereby ensuring that the second dielectric layer 23 has better structural integrity.

In this embodiment, the thickness d2 is a vertical distance between the bottom surface of the capacitor groove 261 and a first surface 221 of the first supporting layer 22, excluding the thickness of the first supporting layer 22, that is, the blocking effect of the first supporting layer 22 on the holes in the side wall of the groove-type lower electrode is not considered. In other embodiments, the thickness factor of the first supporting layer is considered, that is, a height difference is a distance between the bottom surface of the capacitor groove and the top surface of the first supporting layer, which is favorable for improving the position flexibility of the first supporting layer, reducing the position accuracy requirement of the first supporting layer, and increasing the process feasibility.

Figure 12:
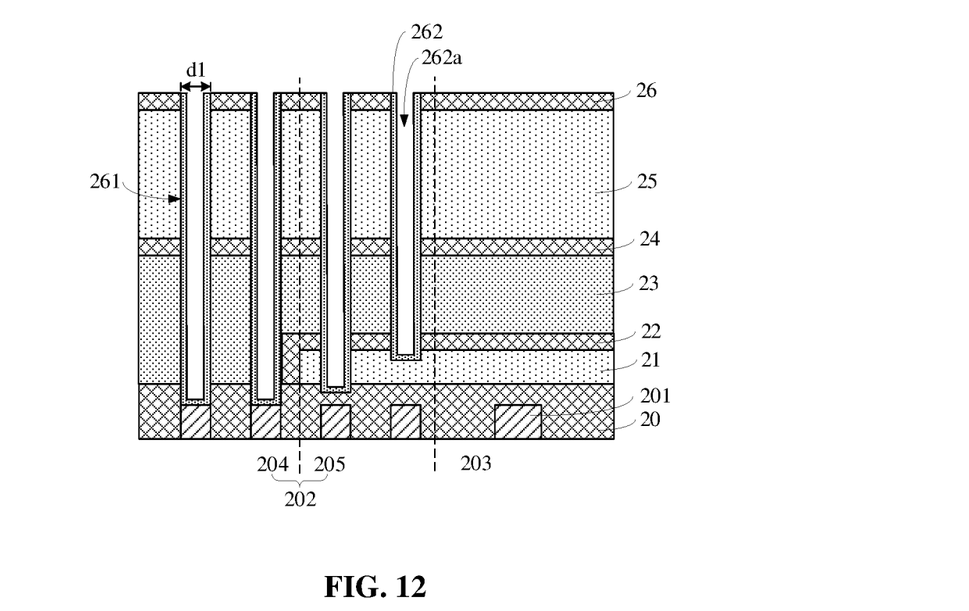

Referring to FIG. 12, groove-type lower electrodes 262 located in the buffer region 205 and the functional region 204 are formed through the same forming process.

During the formation of the groove-type lower electrode 262, since the width d1 of the top opening of the capacitor groove 261 in the buffer region 205 is relatively small and the ratio of the depth to the width is relatively large, the deposition of an electrode material by a deposition process may result in the problems such as uneven deposition thickness and the formation of the hole. The problem of the hole usually occurs in bottom corner regions of the groove-type lower electrode 262. The smaller the width d1 of the top opening, the more serious the problem of the hole.

The groove-type lower electrode 262 has an electrode groove 262a. The etching solution can be in contact with the first dielectric layer 21 through the electrode groove 262a and the holes, thereby etching the first dielectric layer 21.

Figure 13:
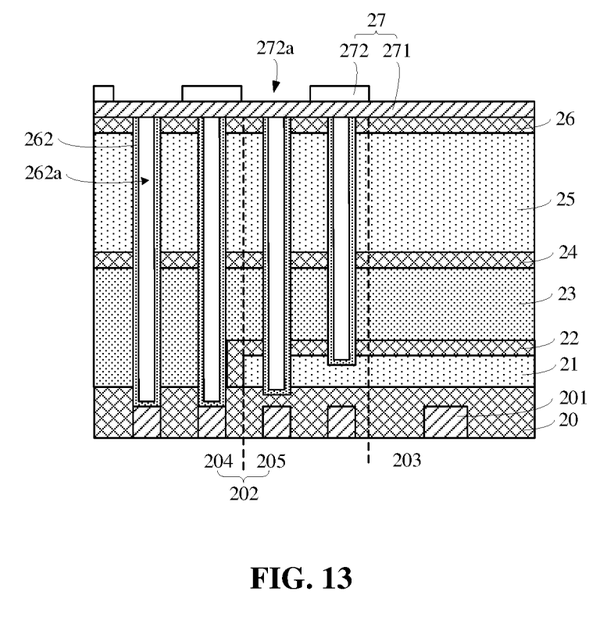

Referring to FIG. 13, a mask layer 27 is formed to perform patterned etching on the third supporting layer 26.

The mask layer 27 includes a hard mask layer 271 and a photoresist layer 272. The photoresist layer 272 has patterned openings 272a, and the patterned openings 272a are configured to define the regions of the third supporting layer 26 to be etched.

In this embodiment, in a direction perpendicular to the surface of the substrate 20, the orthographic projection of the patterned opening 272a coincides with the orthographic projection of a part of the groove-type lower electrode 262, and the orthographic projection of the photoresist layer 272 coincides with the orthographic projection of the groove-type lower electrode 262 with a bottom surface located in the first dielectric layer 21, thereby ensuring that after the third supporting layer 26 is etched, the remaining portion of the mask layer 27 can block the top opening of the specific groove-type lower electrode 262.

Figure 14:
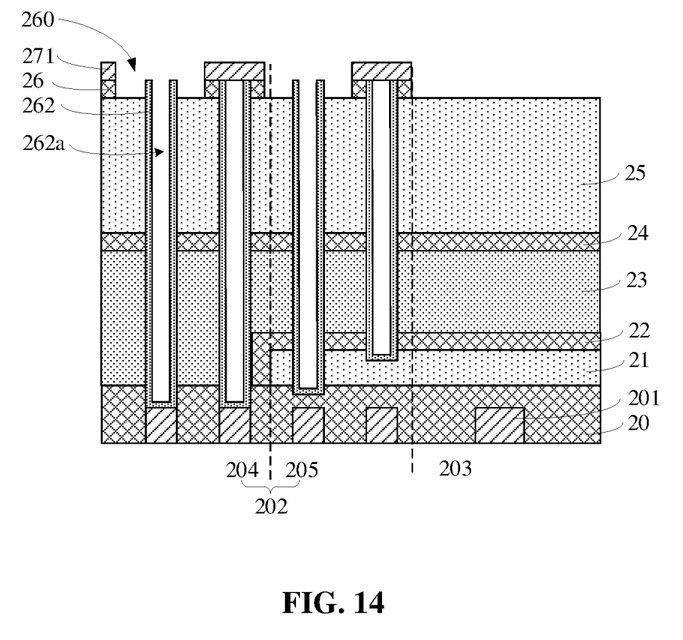

Referring to FIG. 14, the third supporting layer 26 is etched to form first openings 260.

In this embodiment, after the first openings 260 are formed, the photoresist layer 272 (referring to FIG. 13) is removed, in which the hard mask layer 271 is retained, and the remaining portion of the hard mask layer 271 is used to block the top opening of the groove-type lower electrode 262 to prevent the etching solution from being in contact with the first dielectric layer 21 through the electrode groove 262a and bottom holes when the third dielectric layer 25 is subsequently etched, thereby ensuring that the first dielectric layer 21 has better structural integrity.

In this embodiment, the first openings 260 expose the electrode grooves 262a of several groove-type lower electrodes 262 of the groove-type lower electrodes 262. In other embodiments, in a direction perpendicular to the surface of the substrate, the orthographic projection of the first opening does not coincide with the orthographic projection of the groove-type lower electrode, which is favorable for preventing the etching solution for etching the third dielectric layer from entering the electrode groove of any groove-type lower electrode, thereby further ensuring the structural integrity of the first dielectric layer and the second dielectric layer.

Figure 15:
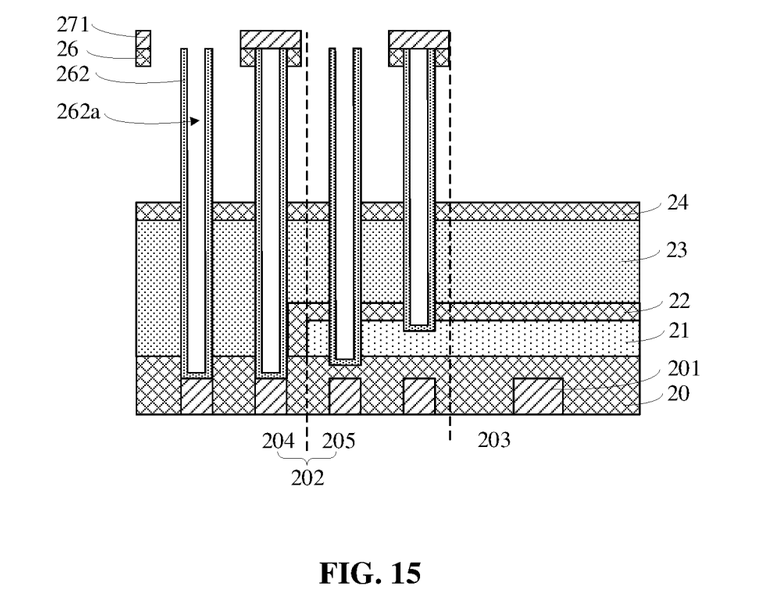
Figure 16:
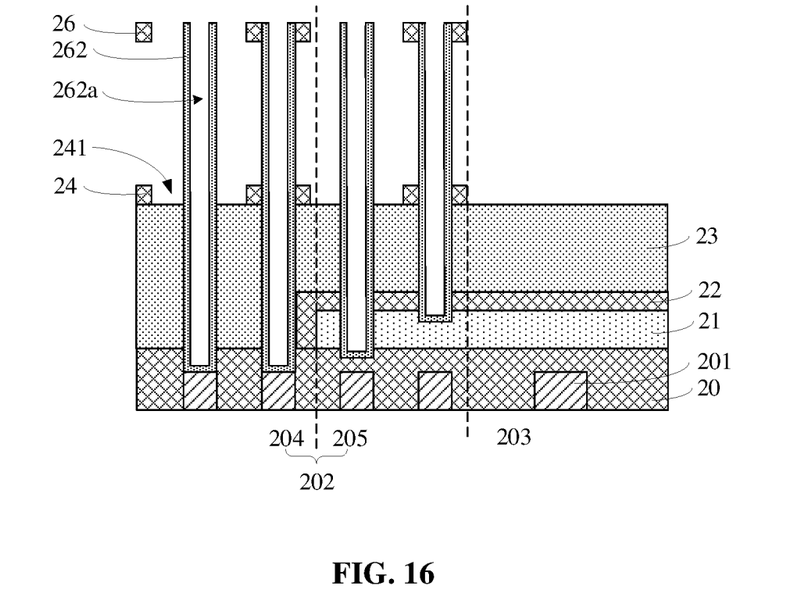

Referring to FIG. 15 and FIG. 16, the third dielectric layer 25 (referring to FIG. 14) is removed, and the second supporting layer 24 is etched to form second openings 241.

In the process of removing the third dielectric layer 25, due to the blocking of the hard mask layer 271, the etching solution cannot enter the electrode groove 262a of the specific groove-type lower electrode 262 and cannot etch the first dielectric layer 21 through the bottom holes, so that the first dielectric layer 21 has better structural integrity.

In this embodiment, the second supporting layer 24 and the remaining portion of the hard mask layer 271 can be etched synchronously by a maskless dry etching process, so as to remove the hard mask layer 271 and form the second openings 241 located in the array region 202 and the peripheral region 203. Since the height difference between the top surface of the second dielectric layer 23 and the top surface of the groove-type lower electrode 262 is relatively large, when the second dielectric layer 23 is subsequently etched by wet etching, the possibility that the etching solution enters the electrode groove 262a is relatively low. Therefore, when the second dielectric layer 23 is etched, the remaining portion of the hard mask layer 271 can be removed.

In this embodiment, in the process of removing the second supporting layer 24 in the peripheral region 203, since the second dielectric layer 23 has better structural integrity and the second dielectric layer 23 and the second supporting layer 24 have a larger etching selection ratio, the second dielectric layer 23 can effectively isolate the etching solution for etching the second supporting layer 24 to prevent the etching solution from being in contact with the substrate 20, thereby ensuring that the substrate 20 and the conductive structure 201 have good performance.

Figure 17:
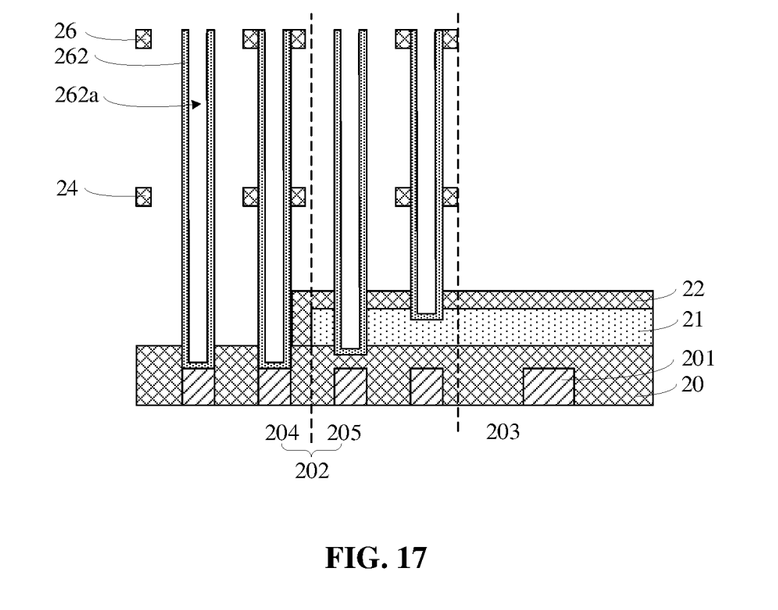

Referring to FIG. 17, the second dielectric layer 23 (referring to FIG. 16) is removed.

In this embodiment, in the process of removing the second dielectric layer 23, the first dielectric layer 21 cannot be additionally etched due to the isolation of the first supporting layer 22. It should be noted that the capacitor structure in the buffer region 205 is usually set only to make the overall logic of the semiconductor structure correct or to ensure that the capacitor structure in the functional region 204 is normal, and the capacitor structure in the buffer region 205 generally does not play a role in data storage. Therefore, the first dielectric layer 21 located in the buffer region 205 cannot affect the performance of the semiconductor structure.

Figure 18:
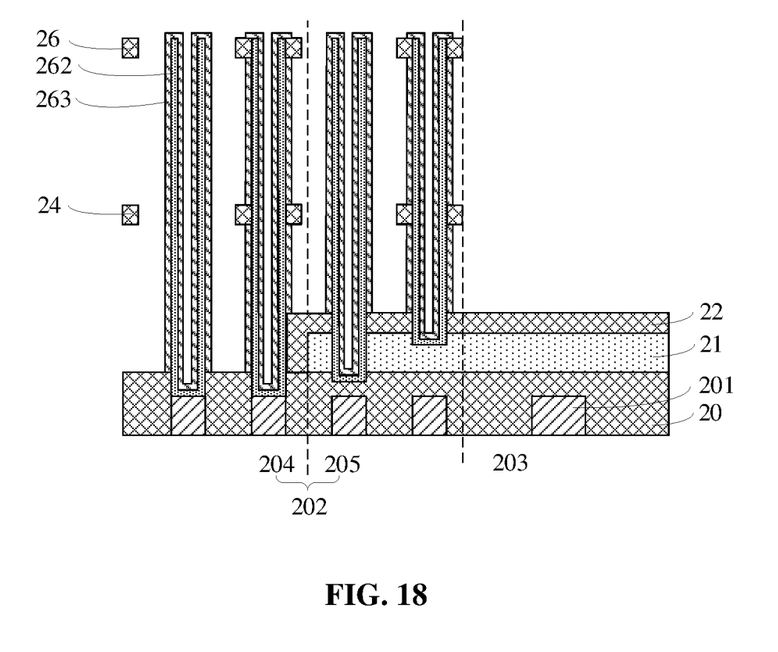
Figure 19:
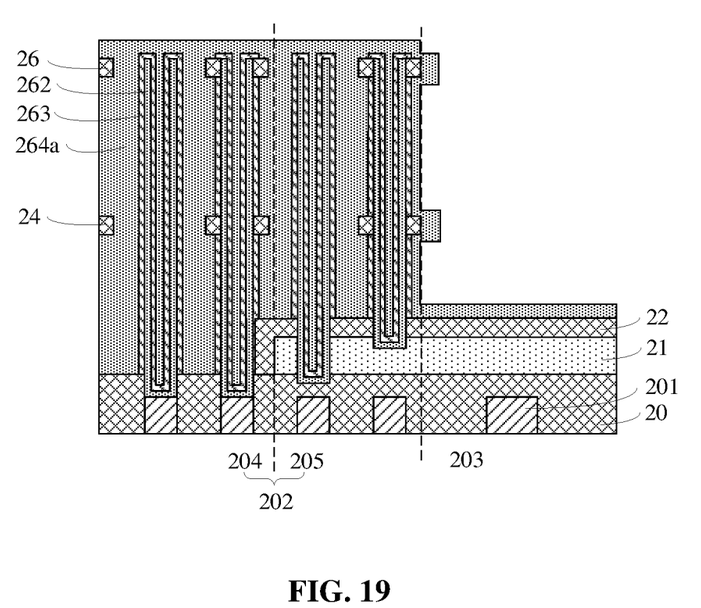
Figure 20:
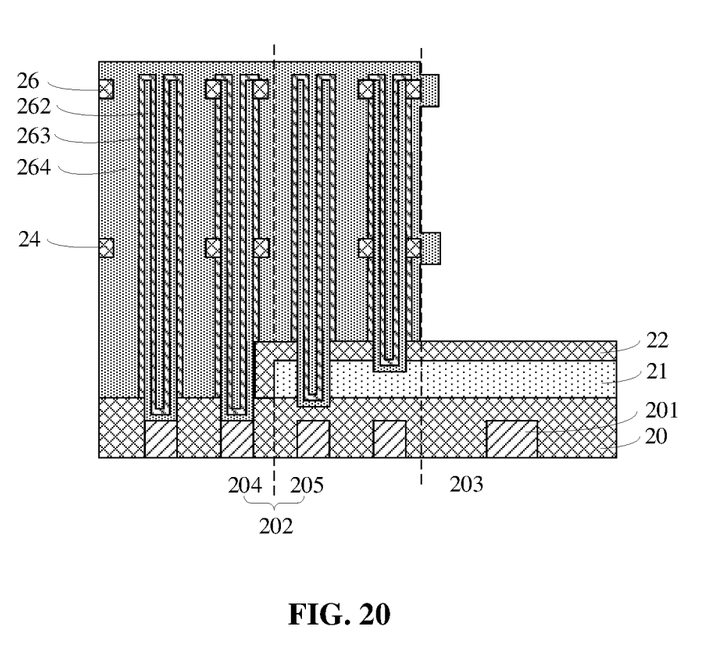

Referring to FIG. 18 to FIG. 20, a capacitor dielectric layer 263 and an upper electrode 264 are formed.

In this embodiment, the capacitor dielectric layer 263 covering the surface of the groove-type lower electrode 262 may be formed by a deposition process, and an upper electrode film 264a covering a surface of the first dielectric layer 21, a surface of the first supporting layer 22, a surface of the capacitor dielectric layer 263, a surface of the second supporting layer 24 and a surface of the third supporting layer 26 may be formed by a deposition process. After the upper electrode film 264a is formed, the upper electrode film 264a in the peripheral region 203 is removed to form the upper electrode 264, thereby avoiding the electrical contact between the upper electrode 264 and a subsequently formed second conductive plug.

Figure 21:
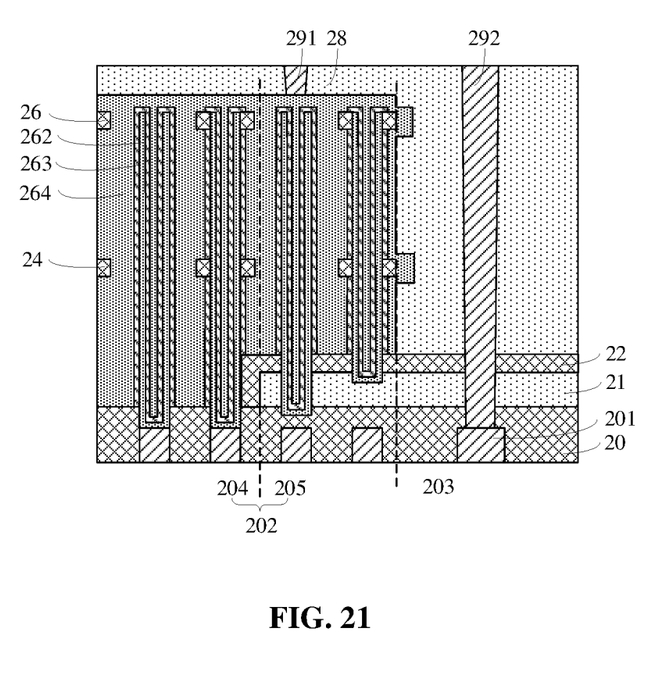

Referring to FIG. 21, an isolation layer 28, a first conductive plug 291 and a second conductive plug 292 are formed.

In this embodiment, after the upper electrode 264 is formed, the isolation layer 28 covering the top surface of the upper electrode 264 and filling the peripheral region 203 is formed by a deposition process. After the isolation layer 28 is formed, the first conductive plug 291 penetrating through the isolation layer 28 and electrically connected with the upper electrode 264 is formed, and the second conductive plug 292 penetrating through the isolation layer 28 and connected with the conductive structure 201 in the peripheral region 203 is formed.

In this embodiment, the dielectric layer between the second supporting layer and the substrate is divided into two layers by forming the first supporting layer in the peripheral region, and the bottom surface of the groove-type lower electrode is located in the first dielectric layer or the second dielectric layer, thereby ensuring that the etching solution formed by leaking can only form a leakage hole in one of the dielectric layers, and the other one of the dielectric layers effectively isolates the etching solution for etching the second supporting layer.

Correspondingly, the embodiments of this application further provide a semiconductor structure which can be manufactured by the above method for manufacturing the semiconductor structure.

Referring to FIG. 21, the semiconductor structure includes: a substrate 20, in which the substrate 20 includes an array region 202 and a peripheral region 203 adjacent to each other, and the array region 202 includes a buffer region 205 connected with the peripheral region 203; a first dielectric layer 21, a first supporting layer 22 and a second supporting layer 24, in which the first supporting layer 22 is arranged in the peripheral region 203, the first supporting layer 22 covers a top surface and a side wall of the first dielectric layer 21, the second supporting layer 24 is arranged in the array region 202, and the second supporting layer 24 is higher than the first supporting layer 22; and a groove-type lower electrode 262, in which the groove-type lower electrode 262 is arranged in the buffer region 205, the groove-type lower electrode 262 penetrates through the second supporting layer 24, and a bottom surface of the groove-type lower electrode 262 is located in the first dielectric layer 21, or a bottom surface of the groove-type lower electrode 262 is located on a side of the first supporting layer 22 away from the first dielectric layer 21 and is lower than the second supporting layer 24.

In this embodiment, the first dielectric layer 21 is arranged in the buffer region 205, and the bottom surface of the groove-type lower electrode 262 is located in the first dielectric layer 21.

In this embodiment, the bottom surface of the groove-type lower electrode 262 is located in the first dielectric layer 21. In a direction perpendicular to a surface of the substrate 20, the thickness of a portion of the groove-type lower electrode 262 located in the first dielectric layer 21 ranges from 90 nm to 110 nm, such as 95 nm, 100 nm or 105 nm.

In this embodiment, the semiconductor structure further includes an upper electrode 264, a first conductive plug 291 and a second conductive plug 292. The upper electrode 264 covers an inner wall and an outer wall of the groove-type lower electrode 262 to form a double-sided capacitor structure, and a capacitor dielectric layer 263 is arranged between the upper electrode 264 and the groove-type lower electrode 262. The first conductive plug 291 is electrically connected with the upper electrode 264. The second conductive plug 292 penetrates through the first supporting layer 22 and the first dielectric layer 21 and is electrically connected with at least one conductive structure 201 in the peripheral region 203.

In this embodiment, the semiconductor structure further includes: a third supporting layer 26 and an isolation layer 28. The third supporting layer 26 is arranged in the array region 202 and is higher than the second supporting layer 24. The groove-type lower electrode 262 penetrates through the third supporting layer 26. The isolation layer 28 is arranged in the array region 202 and the peripheral region 203. The first conductive plug 291 and the second conductive plug 292 penetrate through the isolation layer 28.

In this embodiment, a semiconductor structure is provided. The semiconductor structure includes a first supporting layer arranged in the peripheral region, and the first supporting layer can be used to limit the etching range of the etching solution flowing out of the bottom of the groove-type lower electrode, thereby ensuring the structural integrity of other regions to play a role of protecting the substrate.

A person of ordinary skill in the art can understand that the above embodiments are specific embodiments for implementing this application. In practical applications, various changes can be made in form and details without departing from the spirit and scope of this application. Any person skilled in the art can make changes and modifications without departing from the spirit and scope of this application. Therefore, the protection scope of this application shall be subject to the scope defined by the claims.

The invention claimed is:

1. A method for manufacturing a semiconductor structure, comprising:
providing a substrate, wherein the substrate comprises an array region and a peripheral region adjacent to each other, and the array region comprises a buffer region connected with the peripheral region;
forming a first dielectric layer, a first supporting layer, a second dielectric layer, a second supporting layer and a third dielectric layer, which are successively stacked onto one another, on the substrate, wherein the first supporting layer is arranged at least in the peripheral region and covers a top surface and a side wall of the first dielectric layer, the second dielectric layer covers the first supporting layer and the substrate, and the second supporting layer and the third dielectric layer are arranged in the array region and the peripheral region;
forming a groove-type lower electrode, which at least penetrates through the third dielectric layer and the second supporting layer, in the buffer region, wherein a bottom surface of the groove-type lower electrode is located in the first dielectric layer or located in the second dielectric layer;
removing the third dielectric layer through a wet etching process; and
etching the second supporting layer in the peripheral region after removing the third dielectric layer.

2. The method for manufacturing the semiconductor structure of claim 1, wherein the array region comprises a functional region located in a center of the array region and the buffer region at an edge of the array region, and wherein forming the first dielectric layer and the first supporting layer comprises: forming the first dielectric layer arranged in the buffer region and the peripheral region and a first top supporting layer covering the top surface of the first dielectric layer; and forming a first side wall supporting layer covering the side wall of the first dielectric layer, wherein the first top supporting layer and the first side wall supporting layer form the first supporting layer.

3. The method for manufacturing the semiconductor structure of claim 1, wherein the method comprises: removing the second dielectric layer after etching the second supporting layer.

4. The method for manufacturing the semiconductor structure of claim 3, wherein a conductive structure is provided in the substrate, and the method comprises: forming an upper electrode covering an inner wall and an outer wall of the groove-type lower electrode after removing the second dielectric layer; and forming a first conductive plug and a second conductive plug, the first conductive plug being electrically connected with the upper electrode, and the second conductive plug being electrically connected with the conductive structure in the peripheral region.

5. The method for manufacturing the semiconductor structure of claim 4, wherein the method comprises: forming an upper electrode film covering a surface of the first supporting layer, a surface of the second supporting layer and a surface of the groove-type lower electrode through a deposition process; removing the upper electrode film in the peripheral region to form the upper electrode; forming an isolation layer arranged in the array region and in the peripheral region through a deposition process; and forming the first conductive plug and the second conductive plug which penetrate through the isolation layer, the isolation layer isolating the upper electrode from the second conductive plug.

6. The method for manufacturing the semiconductor structure of claim 1, wherein the array region comprises a functional region located in a center of the array region and the buffer region at an edge of the array region, and wherein the groove-type lower electrode in the buffer region and the groove-type lower electrode in the functional region are formed through a same formation process, a width of an opening of the groove-type lower electrode in the functional region being greater than a width of an opening of the groove-type lower electrode in the buffer region in a direction from the array region to the peripheral region.

7. The method for manufacturing the semiconductor structure of claim 1, wherein the method comprises: forming a third supporting layer covering the third dielectric layer after forming the third dielectric layer, and wherein removing the third dielectric layer comprises: etching the third supporting layer to form a first opening, and etching and removing the third dielectric layer through the first opening.

8. The method for manufacturing the semiconductor structure of claim 1, wherein the method comprises: performing ion doping on the second dielectric layer after forming the second dielectric layer.

9. The method for manufacturing the semiconductor structure of claim 1, wherein the method comprises: removing the third dielectric layer, and etching the second supporting layer to form a second opening.

10. A semiconductor structure, comprising:
- a substrate, wherein the substrate comprises an array region and a peripheral region adjacent to each other, and the array region comprises a buffer region connected with the peripheral region;
- a first dielectric layer, a first supporting layer and a second supporting layer, wherein the first supporting layer is arranged in the peripheral region, the first supporting layer covers a top surface and a side wall of the first dielectric layer, the second supporting layer is arranged in the array region, and the second supporting layer is higher than the first supporting layer; and
- a groove-type lower electrode, wherein the groove-type lower electrode is arranged in the buffer region and penetrates through the second supporting layer, and a bottom surface of the groove-type lower electrode is located in the first dielectric layer, or a bottom surface of the groove-type lower electrode is located on a side of the first supporting layer away from the first dielectric layer and is lower than the second supporting layer.

11. The semiconductor structure of claim 10, wherein the first dielectric layer is arranged in the buffer region, and the bottom surface of the groove-type lower electrode is located in the first dielectric layer.

12. The semiconductor structure of claim 10, wherein the bottom surface of the groove-type lower electrode is located in the first dielectric layer, and in a direction perpendicular to a surface of the substrate, a thickness of a portion of the groove-type lower electrode located in the first dielectric layer ranges from 90 nm to 110 nm.

13. The semiconductor structure of claim 10, further comprising: an upper electrode covering an inner wall and an outer wall of the groove-type lower electrode; a first conductive plug electrically connected with the upper electrode; and a second conductive plug penetrating through the first supporting layer and the first dielectric layer and electrically connected with at least one conductive structure in the peripheral region.

14. The semiconductor structure of claim 13, further comprising: a third supporting layer arranged in the array region and higher than the second supporting layer, the groove-type lower electrode penetrating through the third supporting layer; and an isolation layer arranged in the array region and the peripheral region, the first conductive plug and the second conductive plug penetrating through the isolation layer.

15. The semiconductor structure of claim 10, wherein the array region comprises a functional region located in a center of the array region and the buffer region at an edge of the array region, and wherein the groove-type lower electrode in the buffer region and the groove-type lower electrode in the functional region are formed through a same formation process, a width of an opening of the groove-type lower electrode in the functional region being greater than a width of an opening of the groove-type lower electrode in the buffer region in a direction from the array region to the peripheral region.

\* \* \* \* \*